United States Patent
Lee et al.

(10) Patent No.: US 10,332,773 B2
(45) Date of Patent: Jun. 25, 2019

(54) TRANSPARENT ELECTROSTATIC CARRIER

(71) Applicant: Applied Materials, Inc., Santa Clara, CA (US)

(72) Inventors: Leung Kway Lee, Sunnyvale, CA (US); Michael S. Cox, Gilroy, CA (US); Pallavi Zhang, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 190 days.

(21) Appl. No.: 15/152,489

(22) Filed: May 11, 2016

(65) Prior Publication Data

US 2016/0358803 A1    Dec. 8, 2016

Related U.S. Application Data

(60) Provisional application No. 62/171,214, filed on Jun. 4, 2015.

(51) Int. Cl.
  *H01T 23/00*  (2006.01)
  *H01L 21/683* (2006.01)
  *H01L 21/673* (2006.01)

(52) U.S. Cl.
  CPC .... *H01L 21/6833* (2013.01); *H01L 21/67336* (2013.01)

(58) Field of Classification Search
  CPC .............................................. H01L 21/6833
  See application file for complete search history.

(56) References Cited

U.S. PATENT DOCUMENTS

| | | | |
|---|---|---|---|
| 6,104,595 A | * | 8/2000 | Brown ................. H01L 21/6833 361/212 |
| 6,567,257 B2 | * | 5/2003 | Brown ............... H01L 21/67115 361/234 |
| 6,678,143 B2 | | 1/2004 | Masuda et al. |
| 6,768,627 B1 | | 7/2004 | Kitabayashi et al. |
| 6,781,812 B2 | | 8/2004 | Fuwa et al. |
| 7,881,036 B2 | | 2/2011 | Fujisawa et al. |

(Continued)

FOREIGN PATENT DOCUMENTS

| | | |
|---|---|---|
| JP | H04237148 A | 8/1992 |
| JP | 2002-357838 A | 12/2002 |

(Continued)

OTHER PUBLICATIONS

International Search Report and Written Opinion from related application PCT/US2016/031906.

*Primary Examiner* — Stephen W Jackson
(74) *Attorney, Agent, or Firm* — Patterson + Sheridan, LLP (57) ABSTRACT

Embodiments described herein provide an electrostatic carrier for transferring a substrate. The electrostatic carrier may have a transparent body. The transparent body may have a first surface sized to transport the substrate into and out of a processing chamber. The electrostatic carrier may also have one or more electrostatic chucking electrodes coupled to the transparent body. The one or more electrostatic chucking electrodes may include a transparent conductive oxide material. In certain embodiments the transparent conductive oxide material is an indium-tin oxide material.

17 Claims, 4 Drawing Sheets

(56) References Cited

U.S. PATENT DOCUMENTS

| | | | |
|---|---|---|---|
| 7,892,445 B1 * | 2/2011 | Wei | H01L 21/6831 |
| | | | 216/58 |
| 7,916,447 B2 | 3/2011 | Kobayashi et al. | |
| 8,081,317 B2 * | 12/2011 | Kalkowski | G03F 1/46 |
| | | | 356/511 |
| 8,238,072 B2 | 8/2012 | Fujisawa et al. | |
| 8,325,457 B2 | 12/2012 | Park et al. | |
| 8,335,070 B2 | 12/2012 | Poh | |
| 8,503,156 B2 | 8/2013 | Ray et al. | |
| 8,730,644 B2 | 5/2014 | Fujisawa et al. | |
| 9,287,806 B2 | 3/2016 | Park | |
| 9,673,737 B2 * | 6/2017 | Baldus | H02N 13/00 |
| 2004/0190215 A1 | 9/2004 | Weldon et al. | |
| 2008/0062609 A1 | 3/2008 | Himori et al. | |
| 2008/0123241 A1 | 5/2008 | Bollmann | |
| 2008/0237819 A1 | 10/2008 | Wieland et al. | |
| 2012/0227886 A1 | 9/2012 | Hsiao et al. | |
| 2015/0040387 A1 | 2/2015 | Lu et al. | |
| 2015/0331337 A1 | 11/2015 | Sundarrajan et al. | |
| 2016/0064267 A1 | 3/2016 | Toh et al. | |

FOREIGN PATENT DOCUMENTS

| | | |
|---|---|---|
| JP | 2003-179128 A | 6/2003 |
| JP | 2003-243493 A | 8/2003 |
| JP | 3596127 B2 | 12/2004 |

* cited by examiner

TRANSPARENT ELECTROSTATIC CARRIER

CROSS-REFERENCE TO RELATED APPLICATIONS

This application claims benefit of U.S. Provisional Patent Application Ser. No. 62/171,214, filed Jun. 4, 2015, the entirety of which is incorporated herein by reference.

BACKGROUND

Field

Embodiments of the present disclosure generally relate to a substrate carrier having an electrostatic carrier configured for transporting and securing substrates. More specifically, embodiments described herein relate to an electrostatic carrier featuring an indium-tin oxide electrode.

Description of the Related Art

The demand for mobile, wearable electronics calls for the substrates on which electronic devices are processed to be thinner and lighter in order to meet the demand for conformity and light weight. In the processing of substrates, such as semiconducting substrates and displays, the substrate is held on a carrier or support in a process chamber during processing. The substrate carrier can include an electrostatic carrier that has an electrode capable of being electrically biased to hold the substrate on the carrier. Thus, the electrostatic carrier uses an electrostatic force to secure the substrate thereto. The chucking and dechucking process can be controlled electrically by applying different voltage profiles to the electrostatic carrier.

The use of an electrostatic carrier as compared to other substrate handling techniques, such as mechanical clamping and/or gluing, is favorable in that a lower yield loss is maintained during processing. Mechanical clamping can introduce unwanted particles during processing and gluing can be resource consuming, environmentally hazardous, and cause residue and/or mechanical stress to the substrate when being detached from the carrier. Additionally, both mechanical clamping and gluing may contribute to yield loss during processing.

Furthermore, existing electrostatic carriers may not immediately release a substrate after processing has been completed, resulting in lower throughput. Additionally, existing electrostatic carriers are not designed to be used in high temperature semiconducting processes (temperatures greater than about 450 degrees C.) and are not cost effective. As such, there is a need for an improved electrostatic carrier.

SUMMARY

Embodiments described herein generally relate to an electrostatic carrier for transferring a substrate. The electrostatic carrier may have a transparent body. The transparent body may have a first surface sized to transport the substrate into and out of a processing chamber. The electrostatic carrier may also have one or more electrostatic chucking electrodes coupled to the transparent body. The electrostatic carrier may further include a transparent cover disposed on the transparent body. The transparent body, the one or more electrostatic chucking electrodes, and the transparent cover may form a unitary structure sized to transfer the substrate through a semiconductor slit valve door.

In another embodiment, an electrostatic carrier for transferring a substrate is disclosed. The electrostatic carrier may have a transparent body. The transparent body may have a first surface sized to transport the substrate into and out of a processing chamber. The electrostatic carrier may also have one or more electrostatic chucking electrodes coupled to the transparent body. The one or more electrostatic chucking electrodes may include a transparent conductive oxide material.

In yet another embodiment, a method for dechucking a substrate is disclosed. The method may include electrostatically chucking a substrate to an electrostatic carrier and processing the substrate while electrostatically chucked to the electrostatic carrier. The method may further include dechucking the substrate by exposing an electrostatic chucking electrode of the electrostatic carrier to electromagnetic radiation sufficient to neutralize an electrostatic charge generated by the electrostatic chucking electrodes. The method may also include removing the substrate from the electrostatic carrier.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments of this disclosure and are therefore not to be considered limiting of its scope, for the disclosure may be applied to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Embodiments described herein provide an electrostatic carrier for transferring a substrate. The electrostatic carrier may have a transparent body. The transparent body may have a first surface sized to transport the substrate into and out of a processing chamber. The electrostatic carrier may also have one or more electrostatic chucking electrodes coupled to the transparent body. The one or more electrostatic chucking electrodes may be transparent. For example, the electrostatic chucking electrodes may be fabricated from a transparent conductive material, such as a transparent conductive oxide material. In certain embodiments, the transparent conductive oxide material may be an indium-tin oxide material. The transparency of one or more of the components of the electrostatic carrier enables radiation-assisted release techniques, such as photo-enhanced conductivity, thermally enhanced conductivity, and thermionic emission, to facilitate the dechucking of the substrate from the electrostatic carrier.

Figure 1:
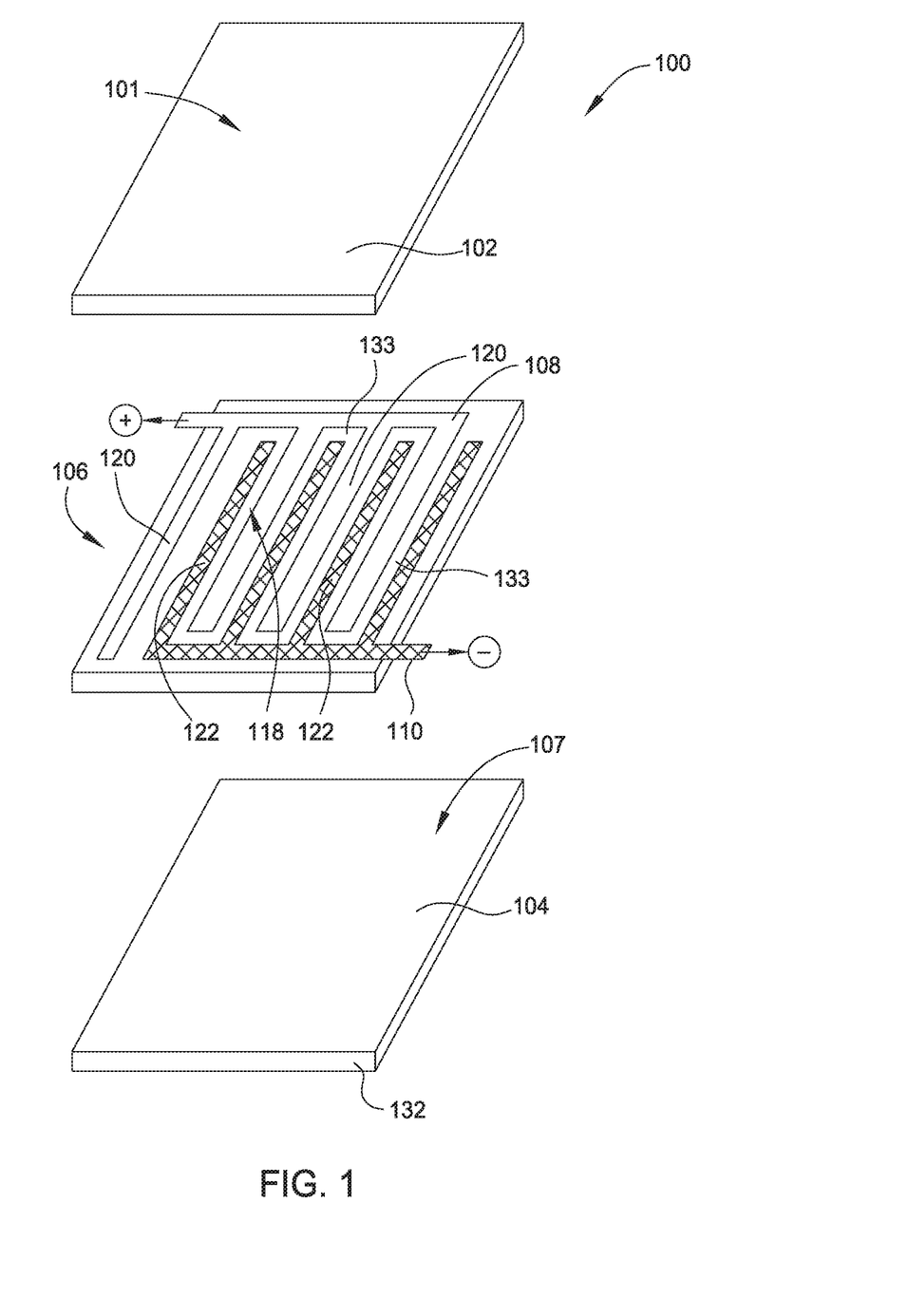
FIG. 1 illustrates an exploded view of an electrostatic carrier according to one embodiment.

FIG. 1 illustrates an exploded view of an electrostatic carrier 100. The electrostatic carrier 100 may be used to hold and transfer substrates in many plasma processes and/or thin-film deposition processes, including plasma-enhanced chemical vapor deposition (PECVD) processes, physical vapor deposition (PVD) processes, chemical vapor deposition (CVD) processes, etching processes, or any suitable plasma or vacuum process. The electrostatic carrier 100 may also be adapted for use in non-plasma and non-vacuum environments. Furthermore, the electrostatic carrier 100 and may be compatible for high temperature applications such as at temperatures in excess of about 450 degrees C., for example at temperatures up to and exceeding about 500 degrees C. Although various embodiments of an electrostatic carrier 100 are disclosed herein, it is contemplated that electrostatic carriers from any manufacturer may be adapted to benefit from embodiments described herein.

The electrostatic carrier 100 includes a body 104, an electrode assembly 106, and a cover 102. The electrode assembly 106 may be disposed on a first surface 107 of the body 104. The cover 102 may be disposed on and cover the first surface 107 of the body 104 and the electrode assembly 106. The body 104 may be formed in any suitable shape for handling and supporting substrates having various shapes and dimensions. In the example depicted in FIG. 1, the body 104 has a quadrilateral shape having a periphery 132 that substantially matches the shape and size of electrode assembly 106, the electrode assembly 106 having a size and shape commensurate with the size and shape of the substrate. The cover 102 is disposed over the electrode assembly 106 to allow a substrate with similar shape and size to be disposed on a top surface 101 of the cover 102. It is noted that the body 104 may be in any shape or configuration as needed. Additionally, the electrode assembly 106 may comprise one or more electrode assemblies 106 and the electrode assemblies 106 may be in any shape or configuration to accommodate various shapes and sizes of substrates. The body 104, the electrode assembly 106, and the cover 102 may form a unitary structure sized to transfer the substrate through a semiconductor slit valve door.

The body 104 may be fabricated from a material transparent to radiation. The body 104 may be fabricated from a dielectric material, such as, by way of example only, a glass material. In one example, the body 104 may be a glass plate. The dielectric material of the body 104 may be an aluminosilicate glass material, a borosilicate glass material, or other suitable glass material. In one example, the body 104 may be made of clear, low-thermal-expansion borosilicate glass, an aluminosilicate glass, or clear tempered soda-lime glass. In certain embodiments, the body may be transparent or translucent. Optionally, in some embodiments the body 104 may be a metallic or a semiconducting body having a dielectric layer disposed on the first surface 107 facing the electrode assembly 106.

The electrode assembly 106 may be disposed on, embedded, and/or coupled to the body 104. The electrode assembly 106 includes at least two sets of distributed electrodes 108, 110. Each distributed electrode 108, 110 may be charged with different polarities as needed when a voltage power is applied thereto, thus generating an electrostatic force. The distributed electrodes 108, 110 may be configured to distribute the electrostatic force across the surface of the cover 102. Each distributed electrode 108, 110 may have a plurality of interleaving electrode fingers 120, 122. It is believed that interleaved electrode fingers 120, 122 provide local electrostatic attraction distributed across a large area of the electrostatic carrier 100 in which the aggregation provides a high chucking force while utilizing less chucking voltage.

The electrode fingers 120, 122 may be formed to have different lengths and geometry. If desired, the electrode fingers 120, 122 may be configured with different sizes intervening to each other. The electrode fingers 120, 122 may alternate and be repeatedly formed until a desired number of electrode fingers 120, 122 are formed.

Between each of the electrode fingers 120 of the first distributed electrode 108, spaces 133 are defined to receive electrode fingers 122 of the second distributed electrode 110. The spaces 133 may be an air gap, filled with a dielectric spacer material, or filled with at least one of the body 104 or cover 102.

It is contemplated that the configuration of the distributed electrodes 108, 110 shown in FIG. 1 is solely for illustrative purposes. The distributed electrodes 108, 110 may be arranged in any desired configuration such that the distributed electrodes 108 are distributed over the first surface 107 of the body 104 with alternating polarity. The concept of having two different sets of electrodes charged with different polarities can be equally well adapted to electrodes arranged in any desired configuration.

The electrostatic carrier 100 may be a bipolar electrostatic carrier, as shown in FIG. 1. However, it is contemplated that other types of electrostatic carriers and/or other types of charging schemes may also be utilized. In one embodiment, the power source (not shown) may be configured to provide RF power which capacitively couples to the distributed electrodes 108, 110 to apply an RF bias to the substrate. In another embodiment, the power source may be configured to provide DC or AC power to the first and the second distributed electrodes 108, 110. The power source may be coupled to the first and the second distributed electrodes 108, 110 through a power switch (not shown). The power source may be configured to provide a voltage power to the first and the second distributed electrode 108, 110 to generate charges with different polarities, either positive or negative charges. The positive or negative charges generated from the first and the second distributed electrode 108, 110 provide an electrostatic force to attract a substrate disposed in the electrostatic carrier 100 in a secured position.

In one embodiment, the electrode assembly 106 may be optically transparent. In another embodiment, the at least two set of distributed electrodes 108, 110 may be optically transparent. In one embodiment, a transparent conductive oxide material 142 may be used as the electrode material to form the distributed electrodes 108, 110 of the electrode assembly 106. In some embodiments, the transparent conductive oxide material 142 may comprise at least one of an indium-tin oxide material, an aluminum-doped zinc-oxide material, an indium-doped cadmium-oxide material, or other suitable transparent conductive materials. The use of a transparent conductive oxide material 142 may allow for the electrostatic carrier 100 to be made substantially transparent. A transparent conductive oxide material 142 is suitable for an electrostatic carrier 100 that is utilized in operation at high temperatures. The coefficient of thermal expansion mismatch between a transparent conductive oxide material 142, such as an indium-tin oxide material, and other dielectric materials, which may be for example other metal oxides, may be relatively small. As such, thermal stress at the interfaces 118 between the distributed electrodes 108, 110 and the metal oxide may be mitigated due to the small coefficient of thermal expansion mismatch. One benefit of an indium-tin oxide material is a closely matched coefficient of thermal expansion to oxide and ceramic materials. Additional benefits of using an indium-tin oxide material to form the electrode assembly 106 may include the low cost of patterning indium-tin oxide on glass, especially on large area glass substrates.

In another embodiment, a wire mesh material may be used as the material to form the distributed electrodes 108, 110 of the electrode assembly 106. The wire mesh material may be a transparent wire mesh material. In another embodiment, the wire mesh material may be a translucent wire mesh material. The wire mesh material may comprise a metal nanowire material, for example, a silver nanowire material. Other suitable metal materials may be used as the metal nanowire material. In one embodiment, the wire mesh material may be deposited by spray coating liquid colloidal metal nanowires. The wire mesh material may be conductive and may provide thermal stress resistance.

Figure 2:
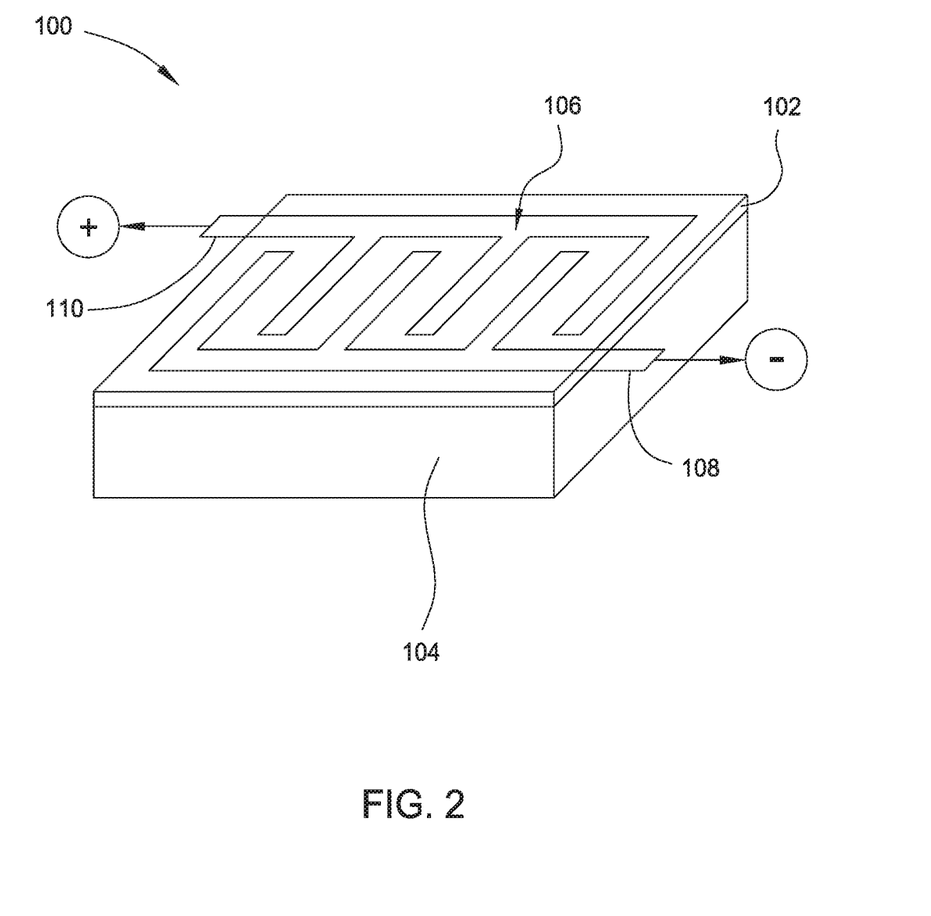
FIG. 2 illustrates a perspective view of an electrostatic carrier according to one embodiment.

As shown in FIG. 2, the cover 102 may be disposed on the body 104 to form the electrostatic carrier 100 as a unitary structure. In one embodiment, the cover 102 and the body 104 sandwich the electrode assembly 106 therebetween. The cover 102 is positioned on the electrode assembly 106 to provide a surface on which the substrate is chucked. The cover 102 may be fabricated from a material transparent to radiation. The cover 102 may also be fabricated from a material having thermal properties, e.g., a coefficient of thermal expansion, substantially matching that of the electrode assembly 106 and/or the body 104. In certain embodiments, the cover 102 may be transparent or translucent.

Adjacent the cover 102, the electrode assembly 106 and the body 104 are stacked in a predetermined order. Subsequently, a bonding process, such as an annealing process, may be performed to fuse the cover 102, the electrode assembly 106, and the body 104 together, forming a laminated structure of the electrostatic carrier 100 as an integral structure. As the cover 102, the electrode assembly 106, and the body 104 may be utilized in a high temperature environment, e.g., greater than about 450 degrees C., for example about 500 degrees C. to about 600 degrees C., the materials used to fabricate these components may be selected from heat resistant materials, such as glass materials or ceramic materials. The heat resistant materials may be suitable for high temperature thermal treatments.

In one embodiment, the cover 102 and the body 104 may both be transparent to radiation. In another embodiment, the cover 102 and the body 104 may be fabricated from a dielectric material. Furthermore, in one embodiment, the cover 102 and the body 104 may be fabricated from the same material. The dielectric material may provide improved strength and durability as well as heat transfer properties. As such, the cover 102 may be fabricated from a dielectric material, such as, by way of example only, a glass material. In one example, the cover 102 may be a glass plate. The dielectric material of the cover 102 may be an aluminosilicate glass material, a borosilicate glass material, or other suitable glass material. In one example, the cover 102 may be made of clear, low-thermal-expansion borosilicate glass, an aluminosilicate glass, or clear tempered soda-lime glass. In another embodiment, the cover 102 and the body 104 may be fabricated from a ceramic material or a composite of ceramic and metal materials. The materials selected to fabricate the cover 102 and the body 104, such as the dielectric materials and glass materials described above, may have a coefficient of thermal expansion that is substantially matched or similar to the electrode assembly 106 to reduce the thermal expansion mismatch. Additionally, the dielectric material may have a coefficient of thermal expansion greater than a coefficient of thermal expansion of the interleaving distributed electrodes 108, 110 of the electrode assembly 106.

Figure 3:
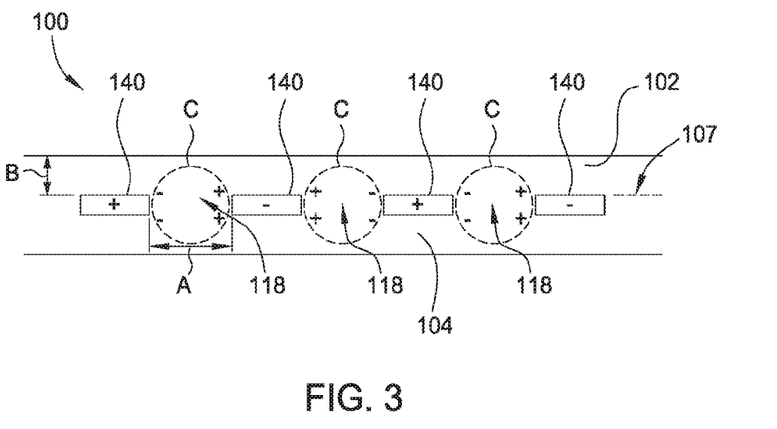
FIG. 3 illustrates a side cross-sectional view of the electrostatic carrier according to one embodiment.

FIG. 3 illustrates a side cross-sectional view of the electrostatic carrier 100 of FIG. 2, according to one embodiment. In the embodiment of FIG. 3, the cover 102 is disposed on the first surface 107 of the body 104. The electrostatic carrier 100 may have one or more channels 140 formed in the first surface 107 of the body 104. The one or more channels 140 may be disposed between the body 104 and the cover 102. The electrode assembly 106 may be disposed in the channels 140 formed in the body 104, such that the two sets of distributed electrodes 108, 110 are formed within the channels 140. The channels 140 may support and/or guide the interleaving distributed electrodes 108, 110 of the electrode assembly 106. Furthermore, the channels 140 may be micro-channels. The channels 140 may be separated from one another by a distance A of between about 5 micrometers and about 400 micrometers, for example, between about 10 micrometers and about 200 micrometers. The cover 102 may have a height B of between about 0.2 micrometers and about 600 micrometers, for example, between about 20 micrometers and about 500 micrometers.

In another embodiment, the transparent conductive oxide material 142 may be reactively sputtered onto a first surface 107 of the body 104 to form the distributed electrodes 108, 110 of the electrode assembly 106. The first surface 107 may be an exterior surface of the body 104. Subsequently, the distributed electrodes 108, 110 may be patterned on the first surface 107 of the body 104. In one embodiment, the cover 102 may be fused to the body 104 thus sandwiching the electrode assembly 106 therebetween. Fusing the cover 102 to the body 104 may be utilized with a screen-printed dielectric layer. Fusing the cover 102 to the body 104 may enclose the dielectric layer and the electrode assembly 106. In another embodiment, the cover 102 may be frit casted over the patterned electrode assembly 106, and onto the body 104. A pressure process may follow the frit casting process. Frit casting the cover 102 onto the body 104 may enclose the dielectric layer and the electrode assembly 106. In some embodiments, the cover 102 may be deposited by a PECVD process in which the cover 102 may be a PECVD dielectric layer deposited over the electrode assembly 106.

As further shown in FIG. 3, the region C may function as a capacitor, storing residual electric charges which prevent the substrate from being dechucked. In order to dechuck the substrate, the residual charges present in region C may be discharged.

Referring now simultaneously to FIGS. 1-3, during operation, a negative charge may be applied to the first distributed electrode 108 and a positive charge may be applied to the second distributed electrode 110, or vice versa, to generate an electrostatic force. During chucking, the electrostatic force generated from the distributed electrodes 108, 110 secures the substrate to the top surface 101 of the cover 102. As the power supplied from the power source is turned off, the charges present in the interface 118 between the distributed electrodes 108, 110 may be maintained over an extended period of time. Oftentimes, the charges present in the interface 118 between the distributed electrodes 108, 110 may be maintained over several hours, for example about six to about eight hours. As such, to begin the release process to dechuck the substrate held on the electrostatic carrier 100, a short pulse of power in the opposite polarity may be provided to the distributed electrodes 108, 110 to remove the charges present in the interface 118.

As discussed above, the use of a transparent conductive oxide material 142, such as an indium-tin oxide material, as well as the use of a transparent body 104 and a transparent cover 102 allows for the electrostatic carrier 100 to remain substantially transparent. The transparency of the electrostatic carrier 100 enables radiation-assisted release techniques, such as photo-enhanced conductivity, thermally enhanced conductivity, and thermionic emission, to facilitate the dechucking of the substrate. As such, the substantially transparent electrostatic carrier 100 may allow for optical radiation to reach the distributed electrodes 108, 110 of the electrode assembly 106 and initiate a photo-enhanced charge density, thus neutralizing the charges stored at the interface 118 (See FIG. 3) and quickly allowing a substrate to be dechucked therefrom.

As described above, when dechucking a substrate from the electrostatic carrier 100, a voltage reversal scheme may be applied to the distributed electrodes 108, 110, however charge may remain built up within the interface 118 between the distributed electrodes 108, 110 within the dielectric after the voltage reversal has been applied. As shown in FIG. 3, the areas C may contain residual electric charge between the distributed electrodes 108, 110, thus continuing to chuck the substrate to the electrostatic carrier 100 despite having applied to voltage reversal scheme. However, the use of radiation assisted release techniques may reduce or eliminate the residual electric charge of the areas C. Accordingly, the substrate may be dechucked from the electrostatic carrier 100 in an efficient manner. For example, the substrate may be dechucked in an amount of time less than about 15 seconds, for example, less than about 10 seconds, such as less than about 5 seconds. As such, the electrode assembly 106 may be configured to receive one or more wavelengths of electromagnetic radiation. Providing electromagnetic radiation, such as one of visible light radiation, ultraviolet radiation, infrared radiation, or thermal radiation to the distributed electrodes 108, 110 of the substantially transparent electrostatic carrier 100 may initiate a photo-enhanced charge mobility, or in certain embodiments, the thermally enhanced conductivity. The photo-enhanced conductivity may neutralize the residual electric charge of the areas C at the interface 118. In one embodiment, the electromagnetic radiation may maintain a wavelength of between about 300 nm and about 800 nm, for example between about 360 nm and about 700 nm. Examples of electromagnetic radiation sources may include xenon lamps, lasers, light emitting diodes (LEDs), such as high-power blue LEDs, and ultraviolet lamps. Additionally, the radiation may be optical radiation or thermal radiation.

The directing of a radiation source and/or electromagnetic radiation at differing wavelengths towards the electrostatic carrier 100 may remotely and/or optically heat the areas C containing the residual electric charges to generate an excess amount of free carriers, i.e. holes and electrons. Holes and electrons are each types of charge carriers responsible for current in a semiconductor material. A hole may be generally defined as the absence of an electron. The electrons may neutralize the positive residual charges within the area C, while the holes may neutralize the negative residual charges within the areas C. The free carriers may move freely to the areas C of the residual charges to neutralize the residual charges, thus dechucking the substrate.

Advantages of optical radiation may include the precise and/or local control of the specific electromagnetic radiation device such that the areas C of residual charges within the electrostatic carrier 100 may be precisely neutralized. As such, the ability to expose specific areas of the electrostatic carrier 100 may be had, or, on the other hand, the entire electrostatic carrier 100 may be scanned with the electromagnetic radiation. After the area C of the electrostatic carrier 100 has received electromagnetic radiation the residual charge within the area C of the electrostatic carrier 100 may be neutralized within less than about fifteen seconds, for example within ten seconds, thus dechucking the substrate attached thereto rapidly.

Figure 4:
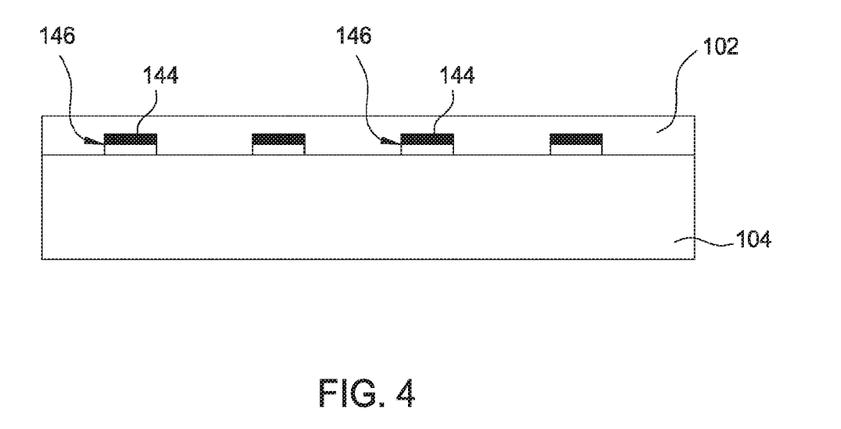
FIG. 4 illustrates a side plan view of a metal oxide layer formed between the transparent conductive oxide material and the cover, according to one embodiment.

FIG. 4 illustrates another embodiment of the electrostatic carrier of FIG. 1. As shown, a metal oxide layer 144 may be formed at an interface 146 between the transparent conductive oxide material 142 and the cover 102. In one embodiment, the metal oxide layer 144 may function as a bonding interface or an adhesion layer between the transparent conductive oxide material 142 and the cover 102. In another embodiment, the metal oxide layer 144 may function as a cushion layer between the transparent conductive oxide material 142 and the cover 102. Furthermore, the metal oxide layer 144 may allow for the transparent conductive oxide material 142 and the cover 102 to contact more securely. In one embodiment, the conductive metal oxide layer 144 may be transparent. In another embodiment, the conductive metal oxide layer may be translucent. The metal oxide layer 144 may be formed to have a thickness selected to make the metal oxide layer 144 transparent or translucent to radiation. The metal oxide layer 144 may be formed to have a thickness of several tens of nanometers, such as between about 5 nm and about 100 nm, for example between about 10 nm and about 80 nm. Additionally, the metal oxide layer 144 may be formed by an oxide deposition.

Figure 5:
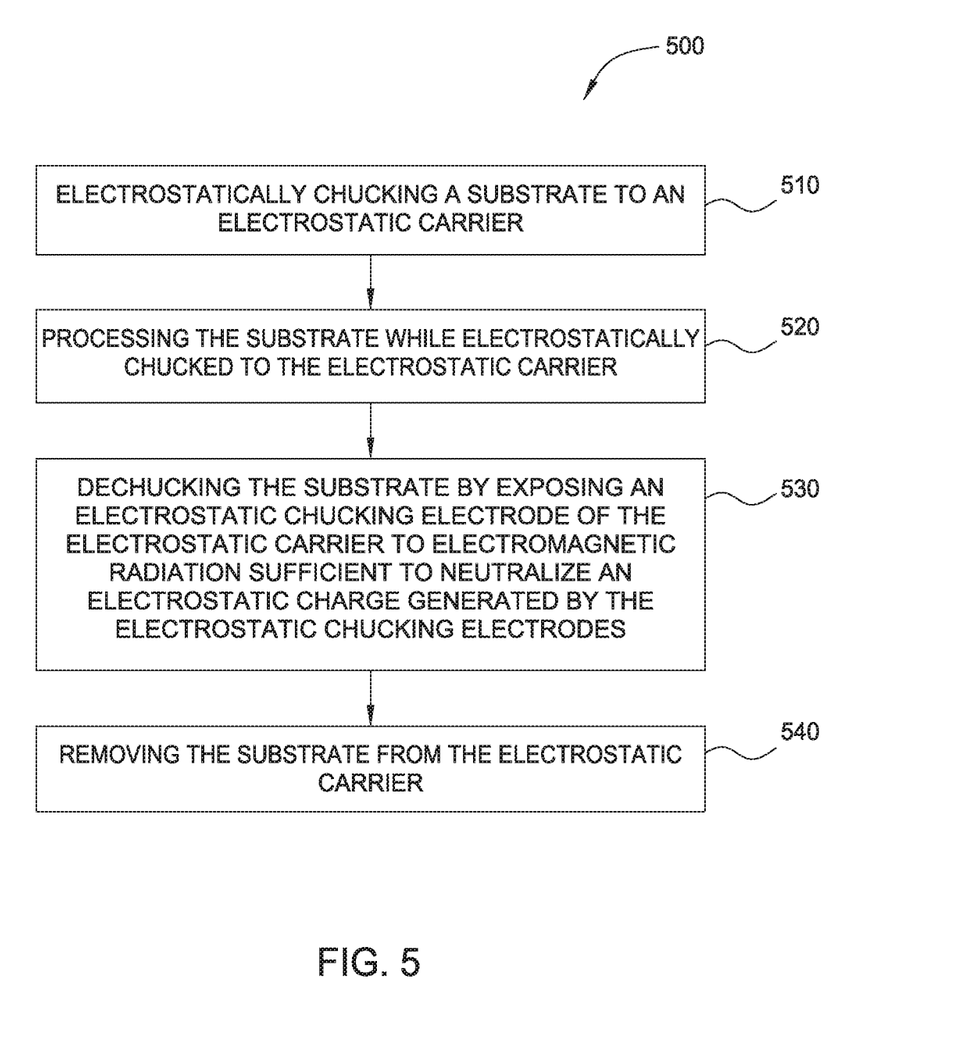
FIG. 5 illustrates a flow diagram of a method for dechucking a substrate, according to one embodiment.

FIG. 5 illustrates a flow diagram 500 of a method for dechucking a substrate, according to one embodiment. Flow diagram 500 begins at operation 510, in which a substrate is electrostatically chucked to an electrostatic carrier. In one embodiment, the substrate may be electrostatically chucked to the electrostatic carrier by applying a first voltage having a first polarity to one or more first interleaving electrostatic chucking electrodes and applying a second voltage having a second polarity opposite the first polarity to one or more second interleaving electrostatic chucking electrodes, thus creating an electrostatic force.

At operation 520, the substrate may be processed while electrostatically chucked to the electrostatic carrier. At operation 530, the substrate may be dechucked by exposing an electrostatic chucking electrode of the electrostatic carrier to electromagnetic radiation sufficient to neutralize an electrostatic charge generated by the electrostatic chucking electrodes. In one embodiment, dechucking the substrate from the electrostatic carrier may include exposing the electrostatic carrier to one or more wavelengths of electrostatic radiation to neutralize the electrostatic charges on the electrode assembly. In some embodiments, exposing the electrode assembly to one or more wavelengths of electrostatic radiation may include exposing the electrode assembly to radiation having a wavelength of between about 300 nm and about 800 nm, for example between about 360 nm and about 700 nm. Furthermore, the electromagnetic radiation may be one of visible light radiation, ultraviolet radiation, infrared radiation, or thermal radiation. At operation 540 the substrate may be removed from the electrostatic carrier.

Thus, the electrostatic carrier disclosed herein features a transparent conductive oxide material electrode capable of operation at high temperatures, such as temperatures in excess of about 450 degrees C. The transparent conductive oxide material electrodes may leverage an indium-tin oxide material to resolve the adverse effects of large thermal stresses resulting from a discrepancy between the coefficients of thermal expansion among common metallic conductors and their associated insulation/encapsulation. The proposed embodiments are suitable for mass production of such transparent conductive oxide material electrode structures. The embodiments disclosed have application in high-temperature operating electrostatic carriers as well as in packaging and encapsulation technologies for devices that may call for resilience to large thermal stresses. Furthermore, the embodiments disclosed may provide for the dechucking of a substrate from a substantially transparent electrostatic carrier with the use of electromagnetic radiation. The electrode assembly of the electrostatic carrier may receive electromagnetic radiation which may neutralize the residual charges within the electrostatic carrier. With the residual charges neutralized, the substrate may be quickly dechucked from the electrostatic carrier, thus increasing throughput and reducing cost and time.

The embodiments disclosed provide an electrostatic carrier for transferring a substrate. The electrostatic carrier may have a transparent body. The transparent body may be sized to transport the substrate into and out of a processing chamber. The electrostatic carrier may also have one or more electrostatic chucking electrodes coupled to the transparent body. In one embodiment, the one or more electrostatic chucking electrodes may include a transparent conductive oxide material. In certain embodiments the transparent conductive oxide material may be an indium-tin oxide material.

It will be appreciated to those skilled in the art that the preceding examples are exemplary and not limiting. It is intended that all permutations, enhancements, equivalents, and improvements thereto that are apparent to those skilled in the art upon a reading of the specification and a study of the drawings are included within the true spirit and scope of the present disclosure. It is therefore intended that the following appended claims include all such modifications, permutations, and equivalents as fall within the true spirit and scope of these teachings.

What is claimed is:

1. An electrostatic carrier for transferring a substrate, the electrostatic carrier comprising:
    a transparent body having a first surface sized to transport the substrate into and out of a processing chamber;
    one or more electrostatic chucking electrodes coupled to the transparent body; and
    a transparent cover disposed on the transparent body, wherein the transparent body, the one or more electrostatic chucking electrodes, and the transparent cover form a unitary structure sized to transfer the substrate through a semiconductor slit valve door.

2. The electrostatic carrier of claim 1 wherein the one or more electrostatic chucking electrodes comprise a transparent conductive oxide material or a transparent wire mesh material.

3. The electrostatic carrier of claim 2 wherein the transparent conductive oxide material comprises at least one of an indium tin oxide material, an aluminum-doped zinc-oxide material, or an indium-doped cadmium-oxide material.

4. The electrostatic carrier of claim I wherein the transparent body and the transparent cover are both formed from a dielectric material.

5. The electrostatic carrier of claim 4, wherein the dielectric material is an aluminosilicate glass material a borosilicate glass material, or a tempered soda-lime glass material.

6. The electrostatic carrier of claim 1, wherein the one or more electrostatic chucking electrodes are interleaving.

7. The electrostatic carrier of claim 1, wherein the one or more electrostatic chucking electrodes are transparent.

8. The electrostatic carrier of claim 1, wherein the one or more electrostatic chucking electrodes are disposed in the transparent body.

9. The electrostatic carrier of claim 1, wherein the one or more electrostatic chucking electrodes are disposed on an exterior surface of the transparent body.

10. The electrostatic carrier of claim 1, wherein the one or more electrostatic chucking electrodes are disposed in a channel formed the transparent body.

11. The electrostatic carrier of claim 1, wherein the one or more electrostatic chucking electrodes are disposed between the transparent cover and the transparent body.

12. An electrostatic carrier for transferring a substrate, the electrostatic carrier composing:
    a transparent body having a first surface sized to transport the substrate into and out of a processing chamber; and
    one or more electrostatic chucking electrodes coupled to the transparent body, the one or more electrostatic chucking electrodes comprising a transparent conductive oxide material.

13. The electrostatic carrier of claim 12, wherein the transparent conductive oxide material comprises at least one of an indium tin oxide material, an aluminum-doped zinc-oxide material, or an indium-doped cadmium-oxide material.

14. The electrostatic carrier of claim 12, wherein the one or more electrostatic chucking electrodes are interleaving.

15. The electrostatic carrier of claim 12, further comprising:
    a transparent cover disposed on the transparent body, wherein the transparent body and the transparent cover are formed from a dialectic material, and wherein the one or more electrostatic chucking electrodes are disposed between the transparent cover and the transparent body.

16. The electrostatic carrier of claim 15, wherein the transparent body, the one or more electrostatic chucking electrodes, and the transparent cover form a unitary structure sized to transfer the substrate through a semiconductor slit valve door.

17. The electrostatic carrier of claim 12, wherein the one or more electrostatic chucking electrodes are disposed on an exterior surface of the transparent body.

* * * * *